METHOD OF LOCATING AND HOLDING SEMICONDUCTOR WAFER
Filed Aug. 22, 1968
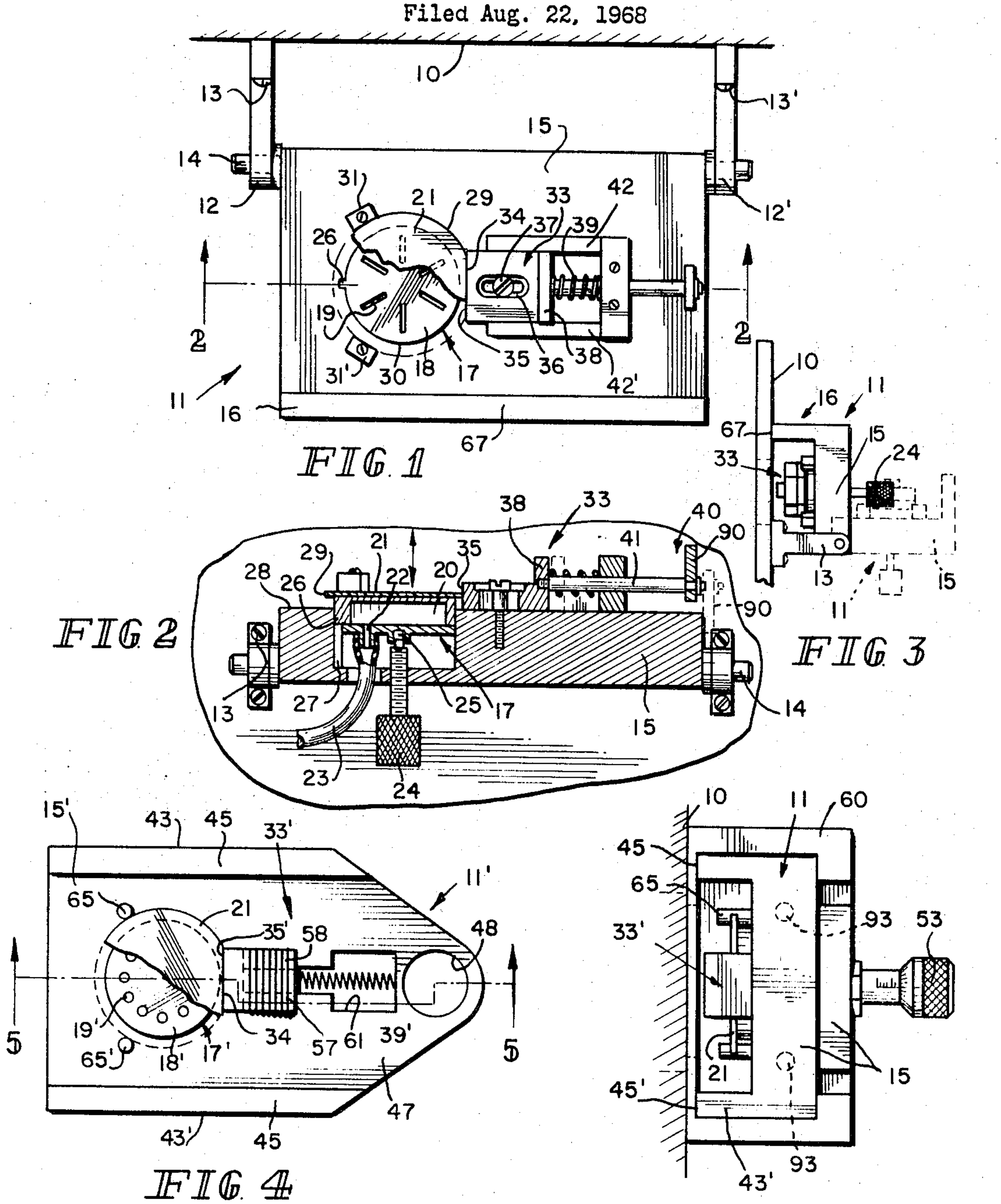
FIG. 1, FIG. 2, FIG. 3, FIG. 4
FIG. 6
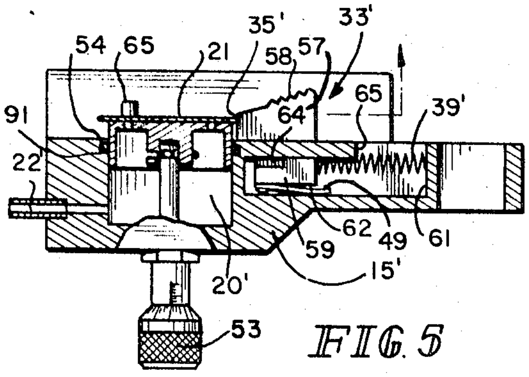
FIG. 5
INVENTOR
VICTOR C. BUNNER
BY Charles W. Hoffman
ATTORNEY 3,564,568

METHOD OF LOCATING AND HOLDING SEMICONDUCTOR WAFER

Victor Craig Bunner, Indianapolis, Ind., assignor to P. R. Mallory & Co., Inc., Indianapolis, Ind. a corporation of Delaware

Filed Aug. 22, 1968, Ser. No. 754,676
Int. Cl. B01j *17/00;* B23q *17/00;* H05k *13/04*
U.S. Cl. 29—572 3 Claims

ABSTRACT OF THE DISCLOSURE

A method for locating and holding a semiconductor wafer with respect to an image of geometrical patterns of a master array through the use of suction to hold said wafer on a support means. The wafer is positioned by engaging and disengaging the edge of the wafer and the wafer is axially aligned by displacing said support means.

The present invention relates to a means and a method for retaining a workpiece such as a semiconductor wafer in a determined position in the horizontal and the vertical planes so that the workpiece may have work functions performed thereon. More particularly, the present invention relates to a semiconductor wafer holder which permits accurate positioning of a semiconductor wafer with respect to images projected thereon from a master array carrying geometrical patterns of desired configurations.

In the manufacture of semiconductor devices, and more particularly in the manufacture of integrated circuits, a master array containing geometrical patterns outlining electronic circuit elements may be brought into intimate contact with a photosensitive emulsion carried by the wafer or the master array may be spaced from the wafer by a finite distance. In either arrangement, the images of the geometrical patterns carried by the master array may be projected onto the semiconductor wafer by illumination from a suitable source to thereby polymerize the photosensitive emulsion where subjected to light. If the master array is spaced from the semiconductor wafer, an optical system may be used to focus the patterns of the master array onto the semiconductor wafer.

The optical system used to project the images of the geometrical patterns onto the photosensitive emulsion carried by the semiconductor wafer may include means which retains the master array of geometrical patterns substantially parallel to a major surface of the semiconductor wafer onto which the geometrical patterns of the master array are to be projected. The master array of geometrical patterns is accurately positioned and aligned in the optical system and retained by a suitable carried means. A source of illumination is positioned substantially to the rear of the master array of geometrical patterns so that the illumination therefrom passes through the master array in such a manner as to project the image of the geometrical patterns onto a forcing means. The focusing means may reduce the image of the geometrical patterns to the desired size. The focusing means projects the reduced images onto the major face of the semiconductor wafer carrying the photosensitive emulsion. In this manner, illumination from the source operates to project an image of the geometrical patterns of the master array onto the photosensitive emulsion substantially covering the major surface of the semiconductor wafer to thereby polymerize the areas of the emulsion exposed to illumination. The use of the optical system to project the patterns of the master array onto the major surface of the wafer substantially avoids several of the difficulties of contact printing such as contamination of the photosensitive emulsion which may effect the photosensitive characteristics thereof.

The semiconductor wafer carries the photosensitive emulsion and, in addition, a passivating layer, that is, an insulative layer such as an oxide layer, between the photosensitive emulsion and the semiconductor material. The photosensitive emulsion polymerizes in those areas exposed to the light while the darkened areas remain substantially unpolymerized. The unpolymerized areas of the photosensitive emulsion may be removed by a suitable developing solution in which the polymerized areas of the photosensitive emulsion are insoluble. The exposed passivating regions of the wafer may be removed by contacting the wafer with a substance which attacks or etches the passivating or oxide layer but which does not attack or etch the polymerized areas of the photosensitive emulsion or the semiconductor material such as silicon. Hydrofluoric acid removes the exposed portion of the oxide layer such as silicon dioxide but will not chemically attack the polymerized emulsion or the silicon wafer. The polymerized photosensitive emulsion may be removed by hot sulfuric acid thereby providing a semiconductor wafer such as a silicon wafer having a passivating layer of silicon dioxide and an exposed area or areas of silicon which conform to the desired geometrical pattern or patterns of the mask.

The precise alignment of the semiconductor wafer with respect to the master array of geometrical patterns is important in contact printing systems and in optical printing. Correct alignment or registration of the wafer in both systems must be achieved to tolerances of a few microns, or even a fraction of a micron to make maximum use of the semiconductor wafer during the manufacture of integrated circuits. Furthermore, alignment or registration of the semiconductor wafer should be done in four coordinates: two lateral dimensions, a vertical dimension, that is, perpendicular to the face of the wafer, and rotation about the center of the wafer. In the usual practice, alignment or registration of the wafer is generally accomplished by engaging the edge of the wafer along the line of a flat surface of the wafer, which forms but a small part of the entire circumferential surface of the wafer, with an alignment means. It should be seen that no rigid or firm support is afforded the wafer other than at the line where the alignment means engages the circumference of the wafer. Thus, if the equipment used to project the patterns or align the wafer is displaced or moved slightly for any reason such as inadvertent handling, the wafer may go askew harmfully effecting the precise alignment necessary between the master array and the semiconductor wafer. In addition, several of the presently available wafer holders do not provide a means for axially aligning the wafer with respect to the master array after the wafer has been mounted onto the wafer holder.

Accordingly, an object of the present invention is to provide a method of holding semiconductor wafer which overcomes the above-enumerated problems.

A further object of the present invention is to provide a method of holding a semiconductor wafer which permits accurate angular and axial alignment of a semiconductor wafer.

Yet another object of the present invention is to provide a method of locating and holding a semiconductor wafer which compensates for variations in the thickness of a semiconductor wafer and which aligns the wafer on the holder.

Other objects of the invention and nature thereof will become apparent from the following description considered in conjunction with the accompanying drawing.

In the drawing:

FIG. 1 is a top view of a semiconductor wafer holder which may be used in either the contact printing process or in the optical system printing process;

FIG. 2 is a cross sectional view of the semiconductor wafer holder taken across the lines 2—2 of FIG. 1;

FIG. 3 illustrates the relative position of the semiconductor wafer holder and a support means in solid and dotted line;

FIG. 4 is a top view of another embodiment of the semiconductor wafer holder of the present invention;

FIG. 5 is a cross sectional view of the semiconductor wafer holder taken across the line 5—5 of FIG. 4; and FIG. 6 is a side view illustrating the cooperation between the semiconductor wafer holder and a support bracket.

Generally speaking, the above and related objects may be achieved by a semiconductor wafer holder which includes a base member. A movable semiconductor wafer support means is carried by the base member and operates to retain or attract a bottom surface of the semiconductor wafer. An adjustment means provides accurate positioning of the wafer in the plane perpendicular to the semiconductor wafer support means thereby compensating for possible variations in the thickness between the semiconductor wafers. An even number of pins projects from the base member to engage the rounded edge of the wafer. A slide member carried by the base member includes a substantially flat surface which may be biased against a flat peripheral surface on the semiconductor. The slide member may include means for restraining it away from the wafer.

Referring more particularly to FIGS. 1, 2 and 3, the reference numeral 10 indicates generally a support member for a semiconductor wafer holder 11. The support member 10 may be fabricated from any suitable structurally strong, non-resilient material such as aluminum, steel and the like. The support member may be an integral part of the housing of an optical system (not shown) used to project an image of a geometrical pattern of a master array (not shown) onto semiconductor wafer 21. The reference numerals 12 and 12′ indicate a pair of spaced apart apertured blocks fixedly connected to the support member 10 by any suitable fastening means 13 and 13′ such as bolts turned into threaded apertures (not shown) in the support member and the like. A shaft 14 is journalled in the apertures of the blocks by any suitable means such as bearings (not shown) and the like in which the shaft may turn. The shaft 14 extends through an unthreaded aperture (not shown) in base member 15 of the semiconductor wafer holder. The base member may be fabricated from any suitable metal such as aluminum or steel. The provision for turning shaft 14 in the journal of the blocks 12 and 12′ and hence the arcuate displacement of the base member from the solid line position to the dotted line position illustrated in FIG. 3 facilitates loading and unloading of a semiconductor wafer 21 from the wafer holder. The base member may include positioning means 16 such as an upturned wall or ridge 67 which engages with a substantially flat surface of the support member 10 when the member is arcuately displaced through an angle of about 90 degrees from the dotted line position to the solid line position illustrated in FIG. 3, thereby providing accurate positioning of the free end of the base 15 in the optical system and hence preliminary positioning of the semiconductor wafer in the optical system.

A semiconductor wafer support means in the form of a chuck 17 is mounted for travel in and with respect to the base member 15. The chuck includes substantially circular face 18 which is substantially parallel to the uppermost surface of the base member. The chuck may be fabricated from any suitable metal such as aluminum, steel and the like. The face 18 of the chuck is provided wtih a series of radially extending apertures or slots 19 for communicating with a source of reduced pressure (not shown) such as a suction means or a vacuum means. The presence of a reduced pressure in chamber 20 of the chuck means retains the semiconductor wafer 21, illustrated as being partially broken away in FIG. 1, on the face 18 of the chuck by attraction or suction. The chamber 20 includes a suitable orifice 22 which fits into a suitable conduit 23 such as a resilient rubber hose and the like which connects the chamber 20 with the source of reduced pressure.

A threaded adjusting means 24 is threaded into a threaded aperture on the rearmost surface of the base member and supports the chuck in the base member by means of a recess 25 which is cooperatively associated with the chuck in the manner illustrated in FIG. 2. Thus, the wafer 21 may be accurately positioned in a direction perpendicular to the base member in order to compensate for variations in the thickness of the wafer by turning the adjusting means either clockwise or counterclockwise. Compensating for variations in the thickness of the wafer is necessary in order to properly focus the image of the master array onto the semiconductor wafer. Proper focusing of the image is necessary to substantially eliminate fuzzy images on the wafer.

The chuck 17 may be provided with a suitable antirotation means 26 such as a key which fits into a complementary keyway 27 suitably formed in the base member by any suitable means such as by milling and the like.

The semiconductor wafer 21 may be a single crystal semiconductor material of generally cylindrical shape having a diameter several centimeters or more and thickness of about tenths of a millimeter or more. The wafer generally includes a substantially flat peripheral edge 34 which assists in angular alignment of the wafer on the face of the chuck means. The remainder of the peripheral edge 29, usually substantially longer in length than the flat edges 34, is generally an irregular circular shape. The semiconductor wafer will normally be a semiconductor material such as silicon, germanium or gallium arsenide which includes a passivating layer (not shown). A photosensitive emulsion (not shown) such as a photoresist film may be applied over the passivating layer.

Angular alignment of the semiconductor wafer may be accomplished in the following manner. It should be noted that the chuck 17 extends above the uppermost surface 28 of the base member, and that the edge 29 of the semiconductor wafer extends slightly beyond the edge 30 of the chuck. The projection of the semiconductor wafer beyond the edge of the chuck allows the use of substantially self-aligning three-point constraint for accurate registration of the semiconductor wafer while retaining adequate axial support for the wafer by means of the face of the chuck 17. A pair of spaced pins 31 and 31′ are displaced about 120 degrees with respect to each other and are substantially perpendicular to the base 15. The pins provide two points of contact which are intended to engage with the circumferential portion of the semiconductor wafer edge 29. A displaceable means such as slide member 33, displaced about 120 degrees from each of the pins and carried by the base, provides the third contact by way of substantially flat face 35 which engages substantially flat edge 34 of the semiconductor wafer. An odd number of point contacts equally spaced about the circumference of the semiconductor wafer provides self-alignment of the semiconductor wafer since the point contacts are not opposite each other. An even number of point contacts equally spaced about the circumference of the wafer does not provide self-alignment of the wafer since the point contacts are equal and opposite from each other.

The slide member 33 may be provided with a shouldered, elongated slot 36 in which is located a retaining screw 37 turned into the base. A pair of spaced apart retaining walls 42 and 42′ substantially prevent the slide member from swivelling about the screw 37. An ear 38 carried by the slide member 33 allows the slide member to be displaced from engagement with the substantially flat edge 34 of the semiconductor during axial alignment of the semiconductor wafer and during loading and unloading the wafer from the wafer holder. The substantially flat face of the slide member may be biased against the wafer flat 34 by a suitable bias means 39 such as a compression spiral spring and the like mounted on a rotatable member 40 including an arm 41 which extends through the length of the bias means 39. The arm includes one extremity connected to an area of the ear 38 and another extremity which includes a suitable handle 90 which may be displaced and rotated to the dotted line position illustrated in FIG. 2. When the slide means is displaced to the dotted line position illustrated in FIG. 2, the slide means is disengaged from the semiconductor wafer and the wafer may be removed from the wafer holder or displaced in the plane perpendicular to the base by turning adjusting means 24 into or out of the threaded aperture in the base member. Withdrawal of the slide means to the dotted line position shown in FIG. 2 is necessary during displacement of the wafer in the plane perpendicular to the base in order to prevent the wafer from being subjected to harmful stress and strain which may be generated by engagement of the three point contact with the wafer. The wafer is fragile and, therefore, may fracture if the slidable means is not displaced to the dotted line position of FIG. 2 during displacement thereof in the plane perpendicular to the base of the wafer holder. The pins 31 and 31', and the slide member 33 provide two relatively small-area contacts with the semiconductor wafer and a third, relatively large-area contact for the substantially flat semiconductor wafer edge 34, in order to achieve an accurate angular alignment for the semiconductor wafer. The diameter of the semiconductor wafer varies up to about 5 millimeters or more from its nominal value. Additionally, the wafer holder groups together the adjustments for the height and angle coordinates on a relatively rigid means. The lateral coordinates may then be adjusted either by providing a means such as a cross slide on the support member 10, or by positioning, e.g., a master array of an optical system at a distance from the wafer. That is, it is advantageous from a practical standpoint to position the semiconductor wafer 21 by grouping the height and angle coordinates together at one location, and to group the lateral coordinates together at a different location.

FIG. 3 shows the relative position of the semiconductor wafer holder and the support member 10. The solid lines illustrate the relative position of the wafer holder and the support member when the ridge 67 engages with the support member. In this position, the image of the master array may be projected onto the semiconductor wafer. When the wafer holder is in the dotted line position, it is intended that a semiconductor wafer be removed from the wafer holder and another semiconductor wafer loaded thereon and aligned in the manner described.

FIGS. 4, 5 and 6 illustrate an embodiment of several different embodiments of the semiconductor wafer holder. Semiconductor wafer holder 11' is adapted to slide into and be retained by a substantially C-shaped support bracket 60 shown in FIG. 6, carried by support member 10. Base member 15' includes a pair of spaced apart walls 43 and 43' having substantially flat surfaces 45 and 45' respectively. The walls are substantially perpendicular to the base member 15'. The base member further includes an integral tang 47 having a suitable means such as a finger aperture 48 for loading the wafer holder into the support bracket or for removing the wafer holder from the support bracket. A chuck 17' has a plurality of apertures 19' formed in face 18' which communicate through chamber 20' to a source of reduced pressure (not shown) such as a suction means or a vacuum means. An inlet means 22' such as an orifice provides a suitable passageway for communication of the chamber to a suction pump (not shown). In addition, the inlet means 22' may be provided with a suitable valve, as may be the wafer holder of FIGS. 1 and 2, which may provide switching of the chamber from the suction pump to a source of compressed air (not shown) which allows the wafer to be floated off of the face of the chuck for easier removal of the semiconductor wafer therefrom by tweezers or other small instruments.

The face 18' of the chuck may be slidably mounted in an aperture formed in the base member as shown in FIG. 4. Fine adjustment of the chuck in the plane perpendicular to the base is accomplished by turning a micrometer screw 53 into or out of base member 15'. The micrometer screw is journalled in the chuck in any suitable manner as shown in FIG. 4.

An O-ring seal member 54 fabricated from any suitable resilient material such as silicone rubber and the like seated in channel 91 may be used to substantially prevent the loss of suction pressure in the chamber 20'.

A slide member 33' is illustrated in FIGS. 4 and 5. The slide member includes a block 57 having a serrated surface 58 which may function as a grip, a substantially flat surface 35' for engaging the substantially flat surface 34 of the semiconductor wafer 21 much in the same manner that flat surface 35 of slide member 33 engages the semiconductor wafer. The guide means 59 is biased toward the chuck 17' by spiral spring 39'. The guide means fits into a substantially T-shaped groove 61 formed in the base member 15'. A lower face 62 of the guide means 59 carries bias means 49 such as a leaf spring. The leaf spring urges the guide means 59 in an upward direction. Movement of the slide member 33' in a direction away from the chuck 17' through a determined distance causes the grooves 64 of the guide means 59 to engage edge 65 of the base member 15'. The slide member 33' will remain engaged with the edge 65 and hence biased away from the chuck until the bias of the leaf spring 63 is overcome by pressing downwardly on the grip 58 of the slide member 33'. It is seen that a locking feature for retaining the slide member 33' displaced from the chuck while the semiconductor wafer is placed on or removed from the face of the chuck is provided. The slide member 33' performs substantially the same function and engages with the wafer 21 in substantially the same manner as does slide member 33 of FIGS. 1 and 2. Pins 65 and 65' are illustrated as being substantially cylindrical and displaced about 120 degrees from each other which provides single point contact between the cooperatively associated pin and the edge 29 of the wafer 21. Pin 65 and 65' perform substantially the same function as do pins 31 and 31' of FIGS. 1 and 2. The slide member should be disengaged from the semiconductor wafer as the chuck face is displaced by the micrometer screw in order to substantially eliminate the possibility of the wafer being subjected to unnecessary stresses and strains which may cause the wafer to fracture.

FIG. 5 shows the substantially C-shaped bracket 60 fixedly connected to the support member 10 by any suitable means such as welding, soldering and the like. The support member may include a plurality of locating pins 93 for accurately locating the wafer holder 11' within the C-shaped bracket. It is seen that the embodiment of the wafer holder illustrated in FIGS. 4, 5 and 6 slides into a bracket which preliminarily positions the wafer holder and that the micrometer is used to accurately position the wafer holder along an optical axis. The wafer holder illustrated in FIGS. 1 and 2 is displaced from its dotted line position shown in FIG. 3 to the solid line position so that it is preliminarily positioned in the optical system. Accurate alignment of the semiconductor wafer is accomplished by turning adjusting means into or out of the base member to thereby displace the semiconductor wafer through the chuck.

Having now described several illustrative embodiments of my invention, I claim:

1. In a method of locating a semiconductor wafer coated with a photosensitive emulsion with respect to an image of geometrical patterns of a master array, said photosensitive emulsion reacting to said image to form an image on said photosensitive emulsion, the improvement comprising holding the semiconductor wafer on a support means by suction and angularly positioning the wafer thereon by positioning means adapted to engage the edge of the wafer, disengaging at least one of said positioning means from the edge of the wafer, and axially aligning the wafer by displacing said support means.

2. In the method of claim 1, wherein said semiconductor wafer includes a passivating layer.

3. In the method of claim 2, wherein said semiconductor wafer is silicon, germanium or gallium arsenide.

References Cited

UNITED STATES PATENTS 2,873,516 2/1959 McCain et al. -------- 29—203

THOMAS H. EAGER, Primary Examiner

U.S. Cl. X.R.

29—407, 203